United States Patent
Kim

(10) Patent No.: US 7,289,051 B2
(45) Date of Patent: Oct. 30, 2007

(54) DIGITAL-TO-ANALOG CONVERTERS INCLUDING CHARGE PUMPS AND RELATED AUTOMATIC LASER POWER CONTROL DEVICES AND METHODS

(75) Inventor: Sang-Seob Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 11/325,963

(22) Filed: Jan. 5, 2006

(65) Prior Publication Data

US 2006/0145904 A1  Jul. 6, 2006

(30) Foreign Application Priority Data

Jan. 5, 2005 (KR) .................. 10-2005-0000804

(51) Int. Cl.
*H03M 1/66* (2006.01)
(52) U.S. Cl. ...................... 341/144; 341/117
(58) Field of Classification Search ................ 341/144, 341/112, 117; 331/14, 16, 17
See application file for complete search history.

(56) References Cited

U.S. PATENT DOCUMENTS

| | | | |
|---|---|---|---|
| 6,255,911 B1 * | 7/2001 | Niwa et al. ................ 331/14 |
| 6,792,063 B1 * | 9/2004 | Ogura ...................... 375/375 |
| 6,967,514 B2 * | 11/2005 | Kizer et al. .............. 327/175 |
| 6,993,106 B1 * | 1/2006 | Momtaz .................... 375/376 |
| 7,064,621 B2 * | 6/2006 | Nakanishi ................. 331/57 |
| 7,068,110 B2 * | 6/2006 | Frey et al. ................ 331/17 |
| 2004/0075462 A1 * | 4/2004 | Kizer et al. .............. 326/29 |
| 2004/0203479 A1 * | 10/2004 | Lin ......................... 455/73 |
| 2006/0114069 A1 * | 6/2006 | Kojima et al. ........... 331/16 |

FOREIGN PATENT DOCUMENTS

| | | |
|---|---|---|
| JP | 06-165068 | 6/1994 |
| JP | 07-236269 | 9/1995 |
| JP | 07-262705 | 10/1995 |
| JP | 2000-349627 | 12/2000 |
| JP | 11-189310 | 1/2001 |
| KR | 1020030073533 | 9/2003 |

OTHER PUBLICATIONS

Notice to Submit Response in Korean Application No. 10-2005-0000804; Date of mailing May 9, 2006.
English translation of Notice to Submit Response in Korean Application No. 10-2005-0000804; Date of mailing May 9, 2006.

* cited by examiner

*Primary Examiner*—Linh Nguyen
(74) *Attorney, Agent, or Firm*—Myers Bigel Sibley & Sajovec

(57) ABSTRACT

A digital-to-analog converter may include a clock signal generator and a charge pump. The clock signal generator may be configured to generate an information clock signal responsive to a digital input signal so that different duty cycles of the information clock signal are provided for different values of the digital input signal. The charge pump may be configured to generate an analog output signal responsive to the information clock signal so that different values of the analog output signal are provided for different duty cycles of the information clock signal. Related converters, methods, and power control devices are also discussed.

30 Claims, 5 Drawing Sheets

DIGITAL-TO-ANALOG CONVERTERS INCLUDING CHARGE PUMPS AND RELATED AUTOMATIC LASER POWER CONTROL DEVICES AND METHODS

RELATED APPLICATION

This application claims the benefit of priority of Korean Patent Application No. 10-2005-0000804, filed on Jan. 5, 2005, in the Korean Intellectual Property Office, the disclosure of which is hereby incorporated herein in its entirety by reference.

FIELD OF THE INVENTION

The present invention relates to electronics, and more particularly, to digital-to-analog (D/A) converters and related methods.

BACKGROUND

An automatic laser power control device of an optical system may maintain an optical level of an optical signal (which is output from a laser diode of an optical pickup unit) at a constant level. More particularly, the automatic laser power control device may maintain the optical level of the output optical signal at a constant level by compensating for changes in the output optical signal caused by temperature variation in the laser diode.

An automatic laser power control device may include a voltage generator that applies a control voltage to a driving circuit of the laser diode to equalize the optical level with an initially set target optical level. The voltage generator, which includes a digital-to-analog (D/A) converter, may provide the following characteristics.

First, when reading data from a disc, an optical system may generate some particular voltages of the voltage generator and measure optical output characteristics (which are the characteristics of an output of the laser diode) to determine a relationship between the optical output characteristics and the voltages generated by the voltage generator. Thus, an output of the voltage generator should provide a wide range of voltage outputs to determine a wide range of laser diode output characteristics.

Second, a voltage signal corresponding to the optical level of an optical signal and an output voltage of the voltage generator may be applied to an input terminal of a gain controller of the automatic laser power control device of the optical system. A gain controller may amplify a difference in level between the voltage signal and the output voltage by a set voltage gain and may output the result of amplification.

For precise control of the voltage gain, the gain controller may set the voltage gain at a high level. Accordingly, a resolution of the output voltage of the voltage generator (which is applied to the input terminal of the gain controller) may be set to a unit of several mV. Third, a linearity of an output of the voltage generator should be provided.

Accordingly, an output of the voltage generator of the optical system may provide a wide range from a ground voltage to a power supply voltage, and an output voltage of the voltage generator may provide resolution of a unit of several mV and linear characteristics. In general, to provide the above described characteristics, an 8 to 10 bit D/A converter may be used as the voltage generator.

A conventional resistive array D/A converter may provide a small layout size but an output of the converter may have significant nonlinear characteristics caused by external factors such as a mismatch in resistances, an error of the ratio of resistances, and/or a change in a switch resistance.

A signal output from a current mode D/A converter may provide improved linear characteristics. However, an increase in the number of bits of the signal may result in an increased number of unit current cells of the converter. A significant current may be consumed and/or a layout size may be increased.

SUMMARY

According to some embodiments of the present invention, a digital-to-analog converter may include a clock signal generator and a charge pump. The clock signal generator may be configured to generate an information clock signal responsive to a digital input signal so that different duty cycles of the information clock signal are provided for different values of the digital input signal. The charge pump may be configured to generate an analog output signal responsive to the information clock signal so that different values of the analog output signal are provided for different duty cycles of the information clock signal. The analog output signal may thus be an analog representation of the digital input signal.

The clock signal generator may be further configured to generate a reference clock signal having a constant duty cycle, and the charge pump may be further configured to generate the analog output signal responsive to a difference between duty cycles of the information clock signal and the reference clock signal. More particularly, the information clock signal and the reference clock signal may have a same period, and/or the reference clock signal may have a duty cycle of about 50%.

The digital input signal may be an n-bit digital input signal, the clock signal generator may be configured to generate the information clock signal responsive to the n-bit digital input signal and a main clock signal, and a period of the information clock signal may be $2^n$ times greater than a period of the main clock signal. Moreover, a duty cycle of the information clock signal may increase with increasing values of the digital input signal, and a duty cycle of the information clock signal may decrease with decreasing values of the digital input signal.

In addition, the charge pump may include a transistor, a resistor, and a capacitor. The transistor may be connected between a supply voltage and an output node, and a control electrode of the transistor may be configured to receive the information clock signal. The resistor may be connected between the output node and a reference voltage, and the capacitor may be connected between the output node and a ground voltage.

More particularly, the digital input signal may comprise power information for an optical signal. In addition, a power detecting circuit may be configured to detect a magnitude of the optical signal, and a gain controller may be configured to generate an optical control signal responsive to an output of the power detecting circuit and responsive to the analog output signal from the charge pump. In addition, a laser diode may be configured to generate the optical signal responsive to the optical control signal.

According to other embodiments of the present invention, a digital-to-analog converter may include a clock signal generator and a charge pump. The clock signal generator may be configured to generate an information clock signal responsive to a digital input signal so that different duty cycles of the information clock signal are provided for different values of the digital input signal. The clock signal generator may also be configured to generate a reference clock signal having a constant duty cycle. The charge pump may be configured to generate an analog output signal responsive to a difference between duty cycles of the information clock signal and the reference clock signal. The analog output signal may thus be an analog representation of the digital input signal.

The charge pump may be further configured so that different values of the analog output signal are provided for different duty cycles of the information clock signal. Moreover, the information clock signal and the reference clock signal may have a same period, and/or the reference clock signal may have a duty cycle of about 50%. In addition, the digital input signal may be an n-bit digital input signal, the clock signal generator may be configured to generate the information clock signal responsive to the n-bit digital input signal and a main clock signal, and a period of the information clock signal may be about $2^n$ times greater than a period of the main clock signal. The duty cycle of the information clock signal may increase with increasing values of the digital input signal, and a duty cycle of the information clock signal may decrease with decreasing values of the digital input signal.

Moreover, the charge pump may include first and second transistors, a resistor, and a capacitor. The first transistor may be connected between a supply voltage and an output node, and a first control electrode of the transistor may be configured to receive the information clock signal. The second transistor may be connected between the output node and a ground voltage, and a second control electrode of the transistor may be configured to receive the reference clock signal. The resistor may be connected between the output node and a reference voltage, and the capacitor may be connected between the output node and a ground voltage.

The digital input signal may comprise power information for an optical signal. Moreover, the digital-to-analog converter may further include a power detecting circuit, a gain controller, and a laser diode. The power detecting circuit may be configured to detect a magnitude of the optical signal, and the gain controller may be configured to generate an optical control signal responsive to an output of the power detecting circuit and responsive to the analog output signal from the charge pump. The laser diode may be configured to generate the optical signal responsive to the optical control signal.

According to still other embodiments of the present invention, a method of converting a digital input signal to an analog output signal may include generating an information clock signal responsive to the digital input signal so that different duty cycles of the information clock signal are provided for different values of the digital input signal. The analog output signal may be generated responsive to the information clock signal so that different values of the analog output signal are provided for different duty cycles of the information clock signal. The analog output signal may thus be an analog representation of the digital input signal.

In addition, a reference clock signal may be generated having a constant duty cycle, and generating the analog output signal may include generating the analog output signal responsive to a difference between duty cycles of the information clock signal and the reference clock signal. Moreover, the information clock signal and the reference clock signal have a same period, and/or the reference clock signal may have a duty cycle of about 50%.

The digital input signal may be an n-bit digital input signal, the clock signal generator may be configured to generate the information clock signal responsive to the n-bit digital input signal and a main clock signal, and a period of the information clock signal may be $2^n$ times greater than a period of the main clock signal. Moreover, a duty cycle of the information clock signal may increase with increasing values of the digital input signal, and a duty cycle of the information clock signal may decrease with decreasing values of the digital input signal. In addition, the digital input signal may comprise power information for an optical signal, and the method may further include detecting a magnitude of the optical signal and generating an optical control signal responsive to the magnitude of the optical signal and responsive to the analog output signal. In addition, the optical signal may be generated responsive to the optical control signal.

According to yet other embodiments of the present invention, a method of converting a digital input signal to an analog output signal may include generating an information clock signal responsive to the digital input signal so that different duty cycles of the information clock signal are provided for different values of the digital input signal. A reference clock signal may be generated having a constant duty cycle, and the analog output signal may be generated responsive to a difference between duty cycles of the information clock signal and the reference clock signal. The analog output signal may thus be an analog representation of the digital input signal.

Different values of the analog output signal may be provided for different duty cycles of the information clock signal. Moreover, the information clock signal and the reference clock signal may have a same period, and/or the reference clock signal may have a duty cycle of about 50%. The digital input signal may be an n-bit digital input signal, generating the information clock signal may include generating the information clock signal responsive to the n-bit digital input signal and a main clock signal, and a period of the information clock signal may be about $2^n$ times greater than a period of the main clock signal. Moreover, a duty cycle of the information clock signal may increase with increasing values of the digital input signal, and a duty cycle of the information clock signal may decrease with decreasing values of the digital input signal.

Moreover, the digital input signal may include power information for an optical signal, the method further include detecting a magnitude of the optical signal. An optical control signal may be generated responsive to the magnitude of the optical output signal and responsive to the analog output signal from the charge pump, and the optical signal may be generated responsive to the optical control signal.

Embodiments of the present invention may provide digital-to-analog (D/A) converters with reduced layout size and/or with improved linear output characteristics using a charge pump.

Some other embodiments of the present invention may provide methods of operating D/A converters with reduced layout size and/or with improved linear output characteristics using a charge pump.

Some additional embodiments of the present invention may provide automatic laser control devices for optical systems including D/A converters with reduced layout size and/or with improved linear output characteristics using a charge pump.

According to some embodiments of the present invention, a digital-to-analog converter may include a clock generator that generates an information clock signal and a reference clock signal by dividing a main clock signal in response to a digital control signal. The information clock signal may have the same cycles and different duty ratios. A charge pump may transform the difference between the duty ratios of the reference clock signal and the information clock signal into an analog voltage.

The reference clock signal may have the same cycles as the information clock signal, and the length of a high level section of the reference clock signal may be approximately equal to that of its low level section. When the digital control signal is an n-bit signal, the cycle of the information clock signal may be $2^n$ times greater than the cycle of the main clock signal.

The information clock signal may have a value of 0 when the digital control signal has a value of 0, and may have a value of 1 when the digital control signal has a value of 1. Moreover, as the value of the digital control signal increases, a duration of a high-level section of the information control signal may gradually increase and the duration of a low-level section of the information control signal may gradually decrease.

The charge pump may include a first current source connected to a supply voltage. A first transistor may have a first terminal connected to the first current source, a gate to which the information signal is input, and a second terminal connected to an output node. A second transistor may have a first terminal connected to the output node and a gate to which the reference clock signal is input. A second current source may be connected between the second terminal of the second transistor and a ground voltage. A resistor may be connected between the output node and a reference voltage. A capacitor may be connected between the output node and the ground voltage. An amount of current output from the first current source may be approximately equal to the amount of current output from the second current source.

The digital-to-analog converter may further include an amplifying unit configured to amplify and output the analog voltage output from the charge pump.

According to other embodiments of the present invention, methods of transforming a digital signal into an analog voltage may include obtaining an information clock signal and a reference clock signal by dividing a main clock signal in response to a digital control signal. The information clock signal may have the same cycles and different duty ratios. A difference between the duty ratios of the reference clock signal and the information clock signal may be transformed into the analog voltage.

According to yet other embodiments of the present invention, an automatic laser power control device of an optical system may use a digital-to-analog converter. The device may include a power detecting circuit configured to detect the optical level of an optical signal. The digital-to-analog converter may generate an analog voltage according to predetermined power measurement information. A gain controller may control the optical level of the optical signal to be maintained at a constant level in response to an output of the power detecting circuit and the analog voltage. The digital-to-analog converter may include a clock generator generating an information clock signal and a reference clock signal by dividing a main clock signal according to the power detecting information. The information clock signal may have the same cycles and different duty ratios. A charge pump may transform the difference between the duty ratios of the reference clock signal and the information clock signal into the analog voltage.

The automatic laser power control device may further include an amplifying unit configured to amplify and output the analog voltage output from the charge pump.

The automatic laser power control device may further include a laser diode driving circuit operating in response to an output of the gain controller, and an optical pickup unit generating the optical signal in response to an output of the laser diode driving circuit.

The optical pickup unit may include a laser diode configured to generate the optical signal in response to an output of the laser diode driving circuit, and a front photo diode configured to detect the optical signal output from the laser diode and to feed the optical signal to the power detecting circuit.

DETAILED DESCRIPTION

Figure 1:
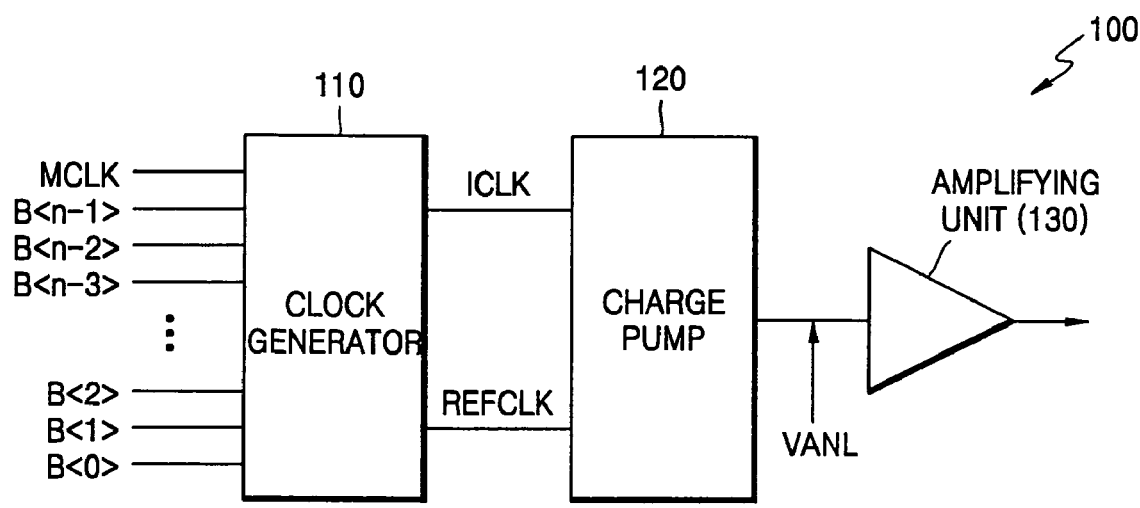
FIG. 1 is a block diagram illustrating a digital-to-analog (D/A) converter according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another embodiment, element, component region, layer or section. Thus, a first embodiment, component, element, region, layer or section discussed below could be termed a second embodiment, component, element, region, layer or section, and, similarly, a second embodiment, component, element, region, layer or section could be termed a first embodiment, component, element, region, layer or section without departing from the teachings of the present invention.

It will also be understood that when an element is referred to as being "connected to" or "coupled to" another element, it can be directly "connected to" or "coupled to" the other element or intervening elements may also be present. In contrast, if an element is referred to as being directly "connected to" or "coupled to" another element, then no other intervening elements are present. The term "directly" means that there are no intervening elements. Finally, as used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a digital-to-analog (D/A) converter 100. The D/A converter 100 includes a clock generator 110 and a charge pump 120.

The clock generator 110 divides a main clock signal MCLK into an information clock signal ICLK and a reference clock signal REFCLK, which have the same cycle (or period) and different duty ratios (or duty cycles), in response to a digital control signal B. The charge pump 120 generates an analog voltage VANL corresponding to the difference between the duty ratios (or duty cycles) of the information clock signal ICLK and the reference clock signal REFCLK.

More particularly, the clock generator 110 may generate the information clock signal ICLK by dividing the main clock signal MCLK in response to the digital control signal B, using an internal counter (not shown). The digital control signal B may be an n-bit digital signal.

The information clock signal ICLK may have a value of 0 when the digital control signal B has a value of 0, and may have a value of 1 when the digital control signal B has a value of 1. As the value of the digital control signal B increases, the duration of a high-level portion of the information clock signal ICLK gradually increases and the duration of a low-level section thereof gradually decreases.

The reference clock signal REFCLK may have the same cycle (or period) as that of the information clock signal ICLK, and a length of a high level section of the reference clock signal REFCLK may be equal to that of its low level section. The clock generator 110 will be further described with reference to FIGS. 2 and 3. Stated in other words, the reference clock signal REFCLK may have a 50% duty cycle.

Figure 2:
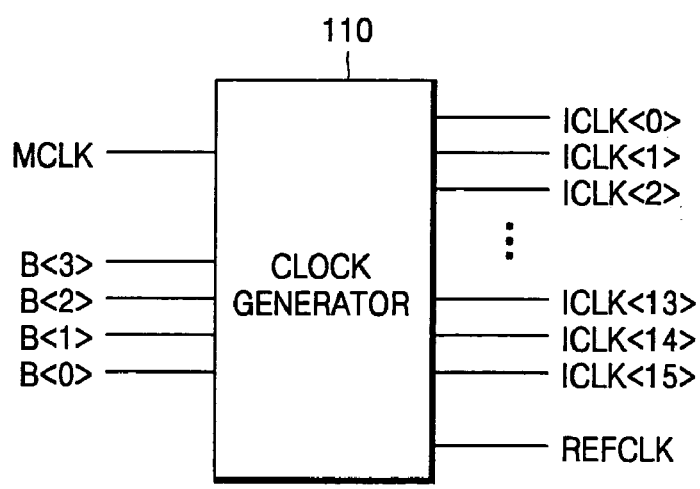
FIG. 2 is a block diagram illustrating a clock generator of FIG. 1 according to embodiments of the present invention.
Figure 3:
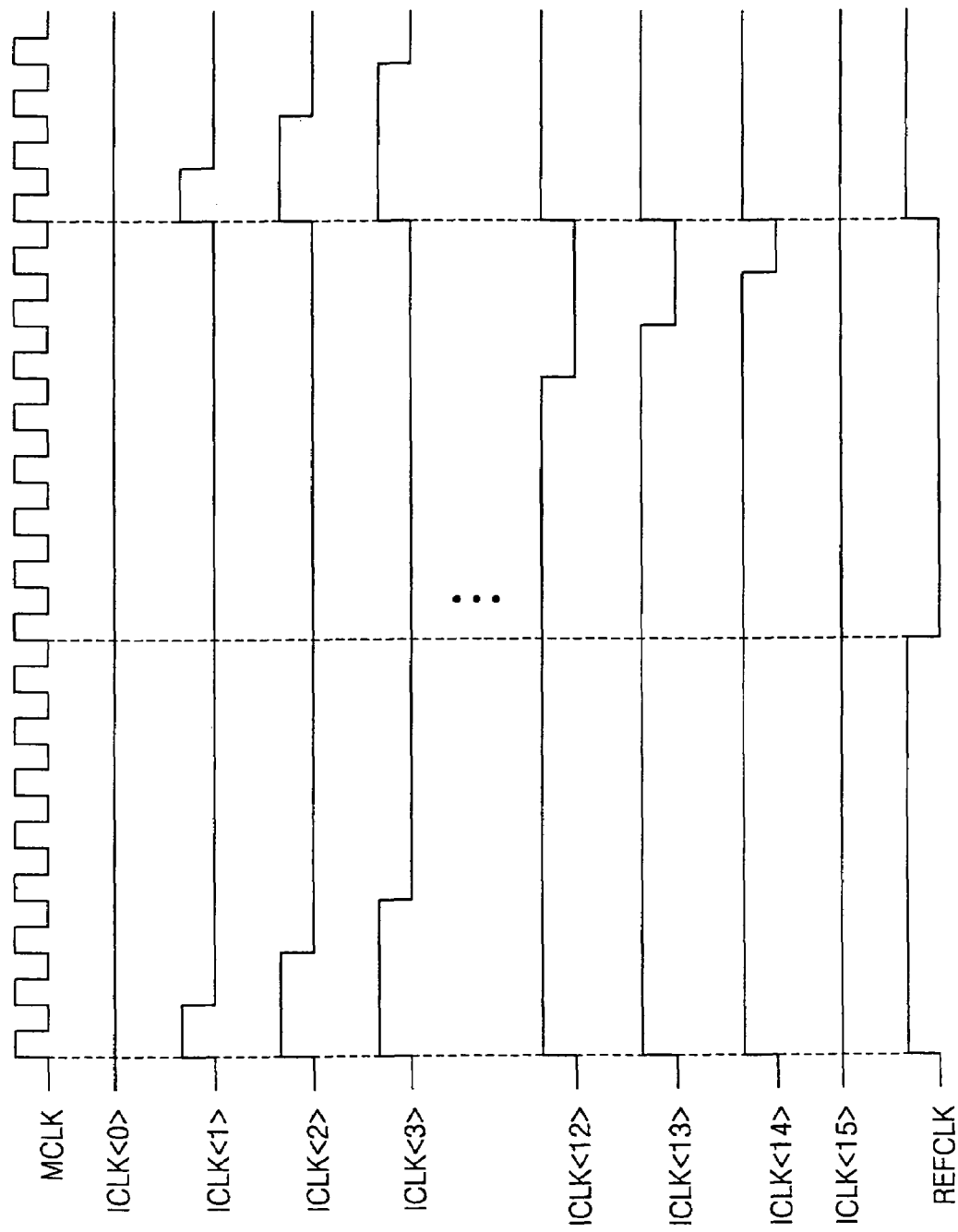
FIG. 3 is a timing diagram illustrating an information clock signal and a reference clock signal of FIG. 1 according to embodiments of the present invention.

FIG. 2 is a view of the clock generator 110 of FIG. 1. FIG. 3 is a timing diagram illustrating an information clock signal ICLK and a reference clock signal REFCLK such as those illustrated in FIG. 1.

The digital control signal B illustrated in FIG. 1 is an n-bit digital signal. The digital control signal B illustrated in FIG. 2 is a 4-bit signal and the 16-bit information clock signal is generated in response to the digital control signal B.

If the digital control signal B is an n-bit signal, and a cycle (or period) of the information clock signal ICLK is $2^n$ times greater than that of a main clock signal MCLK. Referring to FIGS. 2 and 3, since the digital control signal B is a 4-bit signal, the cycle (or period) of the information clock signal ICLK is 16 times greater than that of the main clock signal MCLK.

When the digital control signal B has a value of 0000, the corresponding information clock signal ICLK<0> may have a value of 0 and does not cycle. When the digital control signal B has a value of 1111, the corresponding information clock signal ICLK<15> may have a value of 1 and does not cycle.

Referring to FIG. 3, when the digital control signal B has a value of 0001, the corresponding information clock signal ICLK<1> may go high during one cycle (or period) of the main clock signal MCLK and may go low during fifteen cycles (or periods) of the main clock signal MCLK.

If the digital control signal B has a value of 0010, the corresponding information clock signal ICLK<2> may go high during two cycles (or periods) of the main clock signal MCLK and may go low during fourteen cycles (or periods) of the main clock signal MCLK.

As described above, as the value of the digital control signal B increases, the duration of the high-level portion of the information clock signal ICLK may gradually increase and the duration of the low-level section may gradually decrease.

The reference clock signal REFCLK may have the same cycle (or period) as the information clock signal ICLK, and the length of a high level section of the reference clock signal REFCLK may be approximately equal to that of a low level section. Stated in other words, the reference clock signal may have a duty cycle of approximately 50%. The cycle (or period) of the reference clock signal REFCLK may thus be sixteen times greater than the cycle (or period) of the main clock signal MCLK, and the reference clock signal REFCLK may be high for eight cycles (or periods) of the main clock signal MCLK and low for eight cycles (or periods) of the main clock signal.

Figure 4:
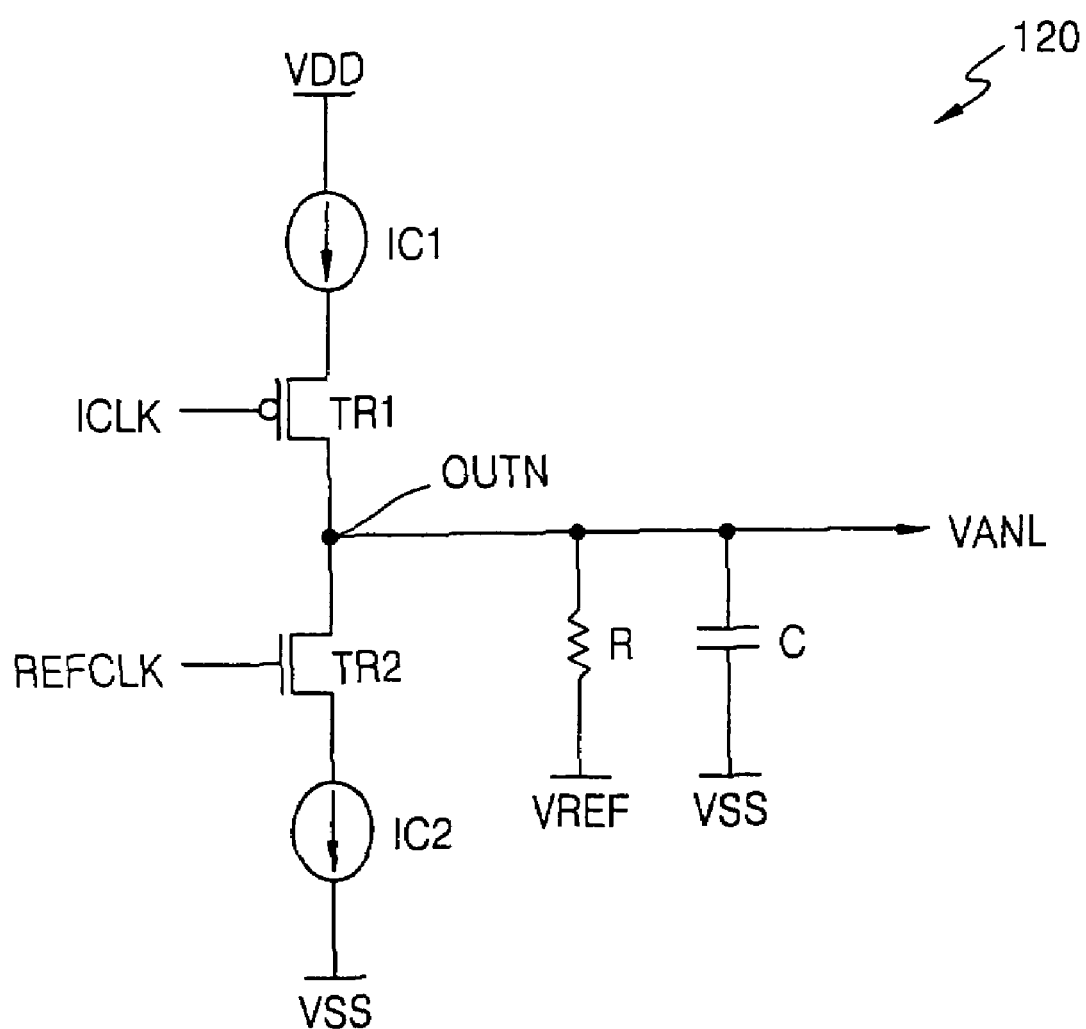
FIG. 4 is a circuit diagram of a charge pump of FIG. 1 according to embodiments of the present invention.

FIG. 4 is a circuit diagram of the charge pump 120 illustrated in FIG. 1. Referring to FIG. 4, the charge pump 120 includes a first current source IC1, a second current source IC2, a first transistor TR1, a second transistor TR2, a resistor R, and a capacitor C.

The first current source IC1 is connected to a supply voltage VDD. A first terminal of the first transistor TR1 is connected to the first current source IC1, an information clock signal ICLK is input to a gate the first transistor TR1, and a second terminal of the first transistor TR1 is connected to an output node OUTN.

A first terminal of the second transistor TR2 is connected to the output node OUTN, and a reference clock signal REFCLK is input to a gate the second transistor TR2. The second current source IC2 is connected between the second transistor TR2 and a ground voltage VSS.

The resistor R is connected between the output node OUTN and a reference voltage VREF. The capacitor C is connected between the output node OUTN and the ground voltage VSS. The reference voltage VREF is set to an analog voltage VANL that is first output from the charge pump 120, determined by a designer of the D/A converter 100.

The charge pump 120 transforms a difference between duty ratios (or duty cycles) of the information clock signal ICLK and the reference clock signal REFCLK into the analog voltage VANL. Referring to FIG. 4, a current output from the first current source IC1 may be equal to a current output from the second current source IC2.

An average amount of current flowing from the first current source IC1 to the second current source IC2 may be controlled by turning on or off the first transistor TR1 in response to the information clock signal ICLK and the second transistors TR1 in response to the reference clock signal REFCLK. Current flowing through the output node OUTN may be supplied to the resistor R and the capacitor C, and the analog voltage VANL may be determined by the amount of the current from the output node OUTN.

In other words, the amount of current to be supplied to the capacitor C and the resistor R may be controlled by a difference between the duty ratios (or duty cycles) of the information signal ICLK and the reference clock signal REFCLK. The difference between currents to be supplied to the capacitor C and the resistor R may be transformed into a voltage difference and output as the analog voltage VANL.

A method of generating the analog voltage VANL will be described in greater detail with respect to an example where the difference between the duty ratios (or duty cycles) of the information clock signal ICLK and the reference clock signal REFCLK is 0. The durations of a high-level portion and a low-level portion of the information clock signal ICLK<7> are equal to durations of a high-level portion and a low-level portion of the reference clock signal REFCLK, respectively.

In this case, the duration that the first transistor TR1 is turned on or off is approximately equal to the duration that the second transistor TR2 is turned on or off, and therefore, a voltage at the output node OUTN may be maintained at the reference voltage VREF and the analog voltage VANL may be equal to the reference voltage VREF.

When the duration of the high-level portion of the information clock signal ICLK is less than that of the high-level portion of the reference clock signal REFCLK, the duration that the first transistor TR1 is turned on is greater than the duration that the second transistor TR2 is turned on. Thus, the voltage at the output node OUTN is greater than the reference voltage VREF.

In contrast, when the duration of the high-level portion of the information clock ICLK is greater than that of the high-level portion of the reference clock REFCLK, the duration that the first transistor TR1 is turned on is less than the duration that the second transistor TR2 is turned on. In this case, the voltage at the output node OUTN is less than the reference voltage VREF.

As described above, the charge pump 120 may control the analog voltage VANL in response to the information clock signal ICLK. In this disclosure, the method of generating the analog voltage VANL has been described with respect to a 4 bit digital control signal B illustrated in FIGS. 2 and 3. If the number of bits of the digital control signal B is greater than 4, an analog voltage VANL may be increased.

As illustrated in FIG. 1, the D/A converter 100 may also include an amplifying unit 130 configured to amplify and output the analog voltage VANL output from the charge pump 120. The amplifying unit 130 may reduce the possibility that the analog voltage VANL from the charge pump 120 changes when external current is supplied to or current is lost from the output node OUTN of the charge pump 120. The amplifying unit 130 may thus act as a buffer.

When a voltage applied to the output node OUTN of the charge pump 120 approximates the supply voltage VDD or the ground voltage VSS, operations of the first and second current sources IC1 and IC2 may assume non-linear characteristics. The amplitude of the voltage at the output node OUTN of the charge pump 120 can be reduced to half a maximum voltage, and a voltage gain of the amplifying unit 130 can be doubled to mitigate effects of non-linear operation.

With the case of the D/A converter 100 according to embodiments of the present invention, an increase in the number of bits may require a change in only a logic circuit (not shown) installed in the clock generator 110 and an increase in the layout size of the logic circuit. Accordingly, it may be relatively easy to change the number of bits and manufacture the D/A converter 100. Further, it may be possible to reduce the layout size of the D/A.

Figure 5:
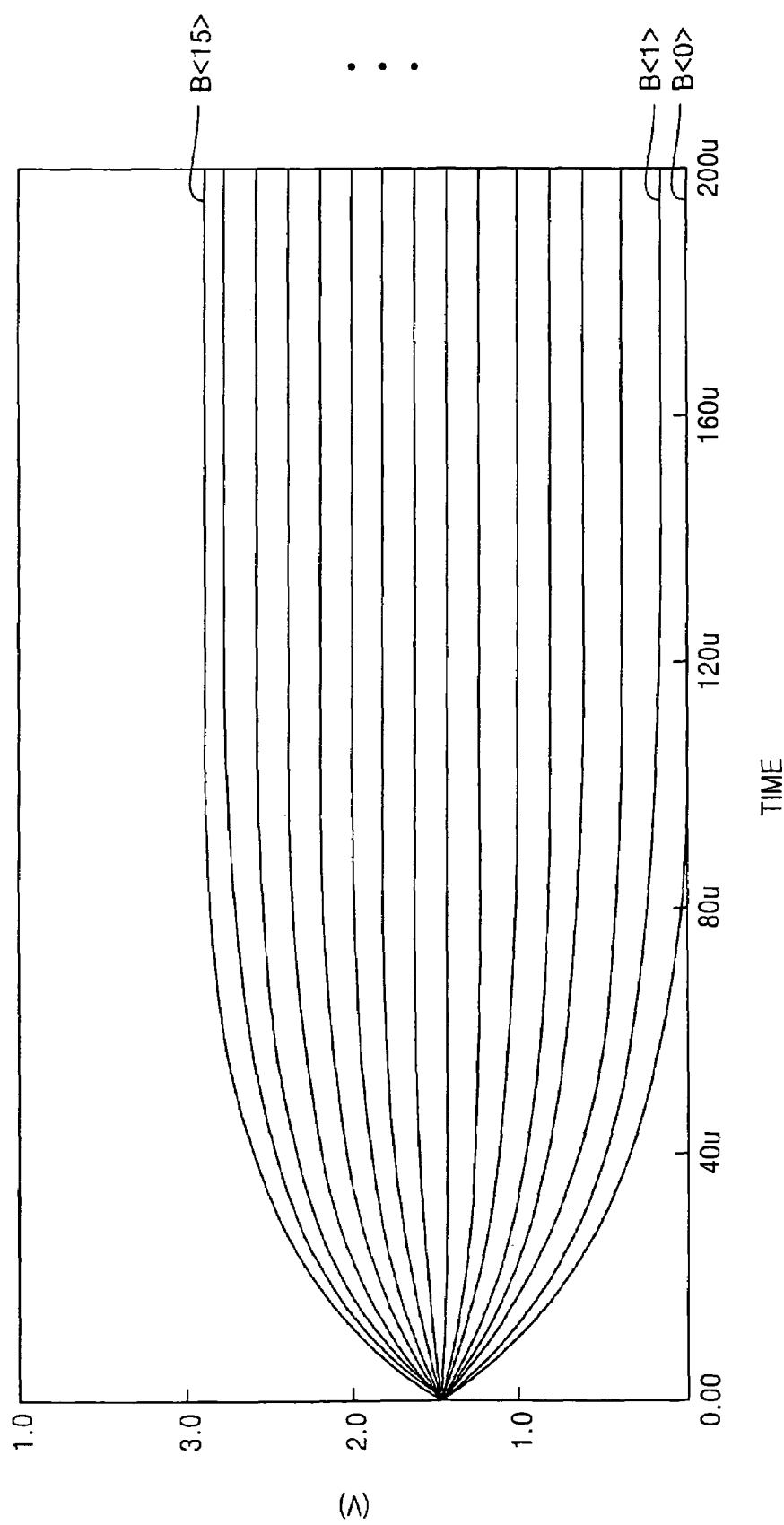
FIG. 5 is a graph illustrating an analog voltage generated in response to a 4-bit digital control signal according to embodiments of the present invention.

FIG. 5 is a graph illustrating an analog voltage generated in response to a 4-bit digital control signal. In the graph, an X-axis denotes time, a Y-axis denotes a voltage over time, and 16 solid lines denote 16 voltages corresponding to 16 information clock signals ICLK. Referring to FIG. 5, an output of the D/A converter 100 may have a wide range from the supply voltage VDD to the ground voltage VSS, and may provide improved linear characteristics.

A method of transforming a digital signal into an analog voltage according to embodiments of the present invention will now be described. First, a main clock signal may be divided into an information clock signal and a reference clock signal which have the same cycles (or periods) and different duty ratios (or duty cycles) in response to a digital control signal. The difference between the duty ratios (or duty cycles) of the reference clock signal and the information clock signal is transformed into the analog voltage.

The information clock signal and the reference clock signal may be generated by the clock generator 110 of FIG. 1. The analog voltage may be generated by the charge pump 120 and provided to the amplifying unit 130 of FIG. 1. Operations of the clock generator 110, the charge pump 120, and the amplifying unit 130 have been described above.

Figure 6:
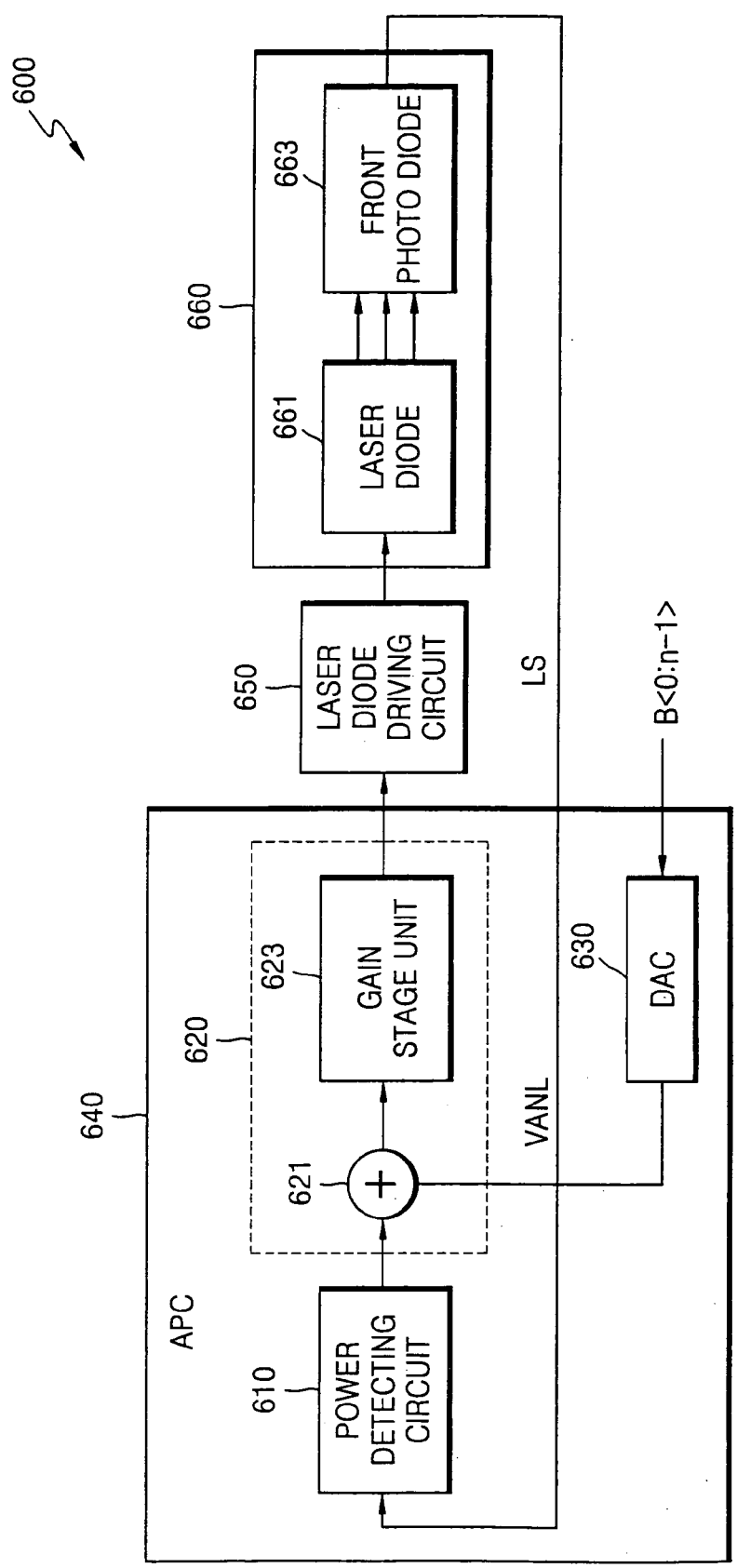
FIG. 6 is a block diagram illustrating an automatic laser power control device of an optical system, which uses a D/A converter according to embodiments of the present invention.

FIG. 6 is a block diagram of an automatic layer power control device 600 of an optical system including a D/A converter according to embodiments of the present invention. The automatic laser power control device 600 may include a power detecting circuit 610, a D/A converter 630, and a gain controller 620.

The power detecting circuit 610 may determine an optical level of an optical signal LS output from an optical pickup unit 660. The optical pickup unit 660 will be described below. The D/A converter 630 may generate an analog voltage VANL according to predetermined power measurement information B<0:n−1>.

The gain controller 620 may control an optical level of the optical signal LS to be maintained at a constant level in response to an output of the power detecting circuit 610 and the analog voltage VANL.

The gain controller 620 includes an adder 621 and a gain stage unit 623. The adder 621 combines the output of the power detecting circuit 610 and the analog voltage VANL, and transmits a signal indicating a result of the combination to the gain stage unit 623. The gain stage unit 623 may control the signal output from the adder 621 according to a set gain and may output the controlled signal. The power detecting circuit 610, the D/A converter 630, and the gain controller 620 may provide an automatic power control unit 640.

The automatic layer power control device 600 may further include a laser diode driving circuit 650 operating in response to an output of the gain controller 620, and an optical pickup unit 660 generating the optical signal LS in response to an output of the laser diode driving circuit 650. The optical pickup unit 660 may include a laser diode 661 that generates the optical signal LS in response to an output of the laser diode driving circuit 650, and a front photo diode 663 that detects the optical signal LS output from the laser diode 661 and feeds it back to the power detecting circuit 610.

Referring to FIG. 6, the automatic laser power control device 600 may detect the optical signal LS output from the optical pickup unit 660, compensate for a change in the optical signal LS using the analog voltage VANL output from the D/A converter 630, and maintain the optical level of the optical signal LS at a relatively constant level by controlling the laser diode driving circuit 650.

For compensation for a change in the optical signal LS, the analog voltage VANL generated by the D/A converter 630 may desirably have a wide range of amplitude and linear characteristics. For this reason, the D/A converter 630 may include a clock generator and a charge pump. The internal construction and operation of the D/A converter 630 may be the same as those of the D/A converter 100 which have been described above. The power measurement information B<0:n−1> input to the D/A converter 630 may be equivalent to the digital control signal B of FIG. 1.

As described above, a D/A converter according to embodiments of the present invention may provide a reduced layout size and may provide an output (i.e., an analog voltage) having improved linear characteristics by using a charge pump. Improved linear characteristics of the analog voltage may provide an increase in performance of an automatic laser power control device of an optical system using a D/A converter according to embodiments of the present invention.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A digital-to-analog converter comprising:
   a clock signal generator configured to generate an information clock signal responsive to a digital input signal so that different duty cycles of the information clock signal are provided for different values of the digital input signal; and
   a charge pump configured to generate the analog output signal responsive to the information clock signal so that different values of the analog output signal are provided for different duty cycles of the information clock signal wherein the charge pump includes,
      a transistor connected between a supply voltage and an output node wherein a control electrode of the transistor is configured to receive the information clock signal,
      a resistor connected between the output node and a reference voltage, and
      a capacitor connected between the output node and a ground voltage.

2. A digital-to-analog converter according to claim 1 wherein a duty cycle of the information clock signal increases with increasing values of the digital input signal and wherein a duty cycle of the information clock signal decreases with decreasing values of the digital input signal.

3. A digital-to-analog converter comprising:
   a clock signal generator configured to generate an information clock signal responsive to a digital input signal so that different duty cycles of the information clock signal are provided for different values of the digital input signal; and
   a charge pump configured to generate the analog output signal responsive to the information clock signal so that different values of the analog output signal are provided for different duty cycles of the information clock signal;
   wherein the clock signal generator is further configured to generate a reference clock signal having a constant duty cycle; and
   wherein the charge pump is further configured to generate the analog output signal responsive to a difference between duty cycles of the information clock signal and the reference clock signal.

4. A digital-to-analog converter according to claim 3 wherein the information clock signal and the reference clock signal have a same period.

5. A digital-to-analog converter according to claim 4 wherein the reference clock signal has a duty cycle of about 50%.

6. A digital-to-analog converter comprising:
   a clock signal generator configured to generate an information clock signal responsive to a digital input signal so that different duty cycles of the information clock signal are provided for different values of the digital input signal; and
   a charge pump configured to generate the analog output signal responsive to the information clock signal so that different values of the analog output signal are provided for different duty cycles of the information clock signal;
   wherein the digital input signal comprises an n-bit digital input signal, wherein the clock signal generator is configured to generate the information clock signal responsive to the n-bit digital input signal and a main clock signal, and wherein a period of the informatibn clock signal is $2^n$ times greater than a period of the main clock signal.

7. A digital-to-analog converter comprising:
   a clock signal generator configured to generate an information clock signal responsive to a digital input signal so that different duty cycles of the information clock signal are provided for different values of the digital input signal wherein the digital input signal comprises power information for an optical signal;
   a charge pump configured to generate the analog output signal responsive to the information clock signal so that different values of the analog output signal are provided for different duty cycles of the information clock signal;
   a power detecting circuit configured to detect a magnitude of the optical signal;
   a gain controller configured to generate an optical control signal responsive to an output of the power detecting circuit and responsive to the analog output signal from the charge pump; and
   a laser diode configured to generate the optical signal responsive to the optical control signal.

8. A digital-to-analog converter according to claim 7 wherein the charge pump includes,
   a transistor connected between a supply voltage and an output node wherein a control electrode of the transistor is configured to receive the information clock signal,
   a resistor connected between the output node and a reference voltage, and
   a capacitor connected between the output node and a ground voltage.

9. A digital-to-analog converter comprising:
   a clock signal generator configured to generate an information clock signal responsive to the digital input signal so that different duty cycles of the information clock signal are provided for different values of the digital input signal, and to generate a reference clock signal having a constant duty cycle; and a charge pump configured to generate the analog output signal responsive to a difference between duty cycles of the information clock signal and the reference clock signal.

10. A digital-to-analog converter according to claim 9 wherein the charge pump is further configured so that so that different values of the analog output signal are provided for different duty cycles of the information clock signal.

11. A digital-to-analog converter according to claim 9 wherein the information clock signal and the reference clock signal have a same period.

12. A digital-to-analog converter according to claim 9 wherein the reference clock signal has a duty cycle of about 50%.

13. A digital-to-analog converter according to claim 9 wherein the digital input signal comprises an n-bit digital input signal, wherein the clock signal generator is configured to generate the information clock signal responsive to the n-bit digital input signal and a main clock signal, and wherein a period of the information clock signal is about $2^n$ times greater than a period of the main clock signal.

14. A digital-to-analog converter according to claim 9 wherein a duty cycle of the information clock signal increases with increasing values of the digital input signal and wherein a duty cycle of the information clock signal decreases with decreasing values of the digital input signal.

15. A digital-to-analog converter according to claim 9 wherein the charge pump includes,
a first transistor connected between a supply voltage and an output node wherein a first control electrode of the transistor is configured to receive the information clock signal,
a second transistor connected between the output node and a ground voltage wherein a second control electrode of the transistor is configured to receive the reference clock signal,
a resistor connected between the output node and a reference voltage, and
a capacitor connected between the output node and a ground voltage.

16. A digital-to-analog converter according to claim 9 wherein the digital input signal comprises power information for an optical signal, the digital-to-analog converter further comprising:
a power detecting circuit configured to detect a magnitude of the optical signal;
a gain controller configured to generate an optical control signal responsive to an output of the power detecting circuit and responsive to the analog output signal from the charge pump; and
a laser diode configured to generate the optical signal responsive to the optical control signal.

17. A method of converting a digital input signal to an analog output signal, the method comprising:
generating an information clock signal responsive to the digital input signal so that different duty cycles of the information clock signal are provided for different values of the digital input signal; and
generating the analog output signal responsive to the information clock signal so that different values of the analog output signal are provided for different duty cycles of the information clock signal;
wherein the digital input signal comprises an n-bit digital input signal, wherein the clock signal generator is configured to generate the information clock signal responsive to the n-bit digital input signal and a main clock signal, and wherein a period of the information clock signal is $2^n$ times greater than a period of the main clock signal.

18. A method according to claim 17 wherein a duty cycle of the information clock signal increases with increasing values of the digital input signal and wherein a duty cycle of the information clock signal decreases with decreasing values of the digital input signal.

19. A method of converting a digital input signal to an analog output signal, the method comprising:
generating an information clock signal responsive to the digital input signal so that different duty cycles of the information clock signal are provided for different values of the digital input signal;
generating the analog output signal responsive to the information clock signal so that different values of the analog output signal are provided for different duty cycles of the information clock signal; and
generating a reference clock signal having a constant duty cycle wherein generating the analog output signal includes generating the analog output signal responsive to a difference between duty cycles of the information clock signal and the reference clock signal.

20. A method according to claim 19 wherein the information clock signal and the reference clock signal have a same period.

21. A method according to claim 19 wherein the reference clock signal has a duty cycle of about 50%.

22. A method of converting a digital input signal to an analog output signal, the method comprising:
generating an information clock signal responsive to the digital input signal so that different duty cycles of the information clock signal are provided for different values of the digital input signal wherein the digital input signal comprises power information for an optical signal;
generating the analog output signal responsive to the information clock signal so that different values of the analog output signal are provided for different duty cycles of the information clock signal;
detecting a magnitude of the optical signal;
generating an optical control signal responsive to the magnitude of the optical signal and responsive to the analog output signal; and
generating the optical signal responsive to the optical control signal.

23. A method according to claim 22 wherein the digital input signal comprises an n-bit digital input signal, wherein the clock signal generator is configured to generate the information clock signal responsive to the n-bit digital input signal and a main clock signal, and wherein a period of the information clock signal is $2^n$ times greater than a period of the main clock signal.

24. A method of converting a digital input signal to an analog output signal, the method comprising:
generating an information clock signal responsive to the digital input signal so that different duty cycles of the information clock signal are provided for different values of the digital input signal;
generating a reference clock signal having a constant duty cycle; and
generating the analog output signal responsive to a difference between duty cycles of the information clock signal and the reference clock signal.

25. A method according to claim 24 wherein different values of the analog output signal are provided for different duty cycles of the information clock signal.

26. A method according to claim 24 wherein the information clock signal and the reference clock signal have a same period.

27. A method according to claim 24 wherein the reference clock signal has a duty cycle of about 50%.

28. A method according to claim 24 wherein the digital input signal comprises an n-bit digital input signal, wherein generating the information clock signal comprises generating the information clock signal responsive to the n-bit digital input signal and a main clock signal, and wherein a period of the information clock signal is about $2^n$ times greater than a period of the main clock signal.

29. A method according to claim 24 wherein a duty cycle of the information clock signal increases with increasing values of the digital input signal and wherein a duty cycle of the information clock signal decreases with decreasing values of the digital input signal.

30. A method according to claim 24 wherein the digital input signal comprises power information for an optical signal, the method further comprising:
    detecting a magnitude of the optical signal;
    generating an optical control signal responsive to the magnitude of the optical output signal and responsive to the analog output signal from the charge pump; and
    generating the optical signal responsive to the optical control signal.

* * * * *